United States Patent
Rochman et al.

(10) Patent No.: US 9,537,511 B2
(45) Date of Patent: Jan. 3, 2017

(54) METHODS, CIRCUITS, SYSTEMS AND COMPUTER EXECUTABLE INSTRUCTION SETS FOR PROVIDING ERROR CORRECTION OF STORED DATA AND DATA STORAGE DEVICES UTILIZING SAME

(71) Applicant: Spansion LLC, Sunnyvale, CA (US)

(72) Inventors: Amir Rochman, Maccabim (IL); Kobi Danon, Tel Aviv (IL); Avri Harush, Herzlia (IL)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 240 days.

(21) Appl. No.: 14/073,031

(22) Filed: Nov. 6, 2013

(65) Prior Publication Data

US 2015/0128011 A1 May 7, 2015

(51) Int. Cl.
*H03M 13/15* (2006.01)
*G06F 11/10* (2006.01)
*H03M 13/00* (2006.01)

(52) U.S. Cl.
CPC ...... *H03M 13/1545* (2013.01); *G06F 11/1012* (2013.01); *H03M 13/151* (2013.01); *H03M 13/158* (2013.01); *H03M 13/6561* (2013.01)

(58) Field of Classification Search
CPC ............ G06F 11/1008; G06F 11/1012; H03M 13/152; H03M 13/151; H03M 13/15; H03M 13/158; H03M 13/159; H03M 13/1545; H03M 13/6561

USPC .......................... 714/758, 763, 773, 781–785
See application file for complete search history.

(56) References Cited

U.S. PATENT DOCUMENTS

| | | | | |
|---|---|---|---|---|
| 8,418,028 B2* | 4/2013 | Yamaga | ............ | G06F 11/1068 714/763 |
| 8,468,432 B2* | 6/2013 | Yang | ................. | G06F 11/1048 714/781 |
| 8,806,308 B2* | 8/2014 | Srivastava | ............ | H03M 13/15 714/782 |
| 2014/0075266 A1* | 3/2014 | Fujiwara | ................. | G06F 11/10 714/763 |

OTHER PUBLICATIONS

"Ultra-Fast-Scalable BCH Decoder With Efficient-Extended Fast Chien Search" Hans Kristian, Hernando Wahyono, Kiki Rizki, Trio Adiono School of Electrical and Informatics Engineering, Bandung Institute of Technology (ITB), Bandung, Indonesia; 2010 IEEE, pp. 338-343.

(Continued)

*Primary Examiner* — Christine Tu
(74) *Attorney, Agent, or Firm* — Vladimir Sherman; Professional Patent Solutions (57) ABSTRACT

Disclosed are methods for reading a set of bits from a NVM array (such as a SPI or parallel NOR NVM or otherwise) including: retrieving each of the set of bits from the NVM array substantially in parallel, applying substantially in parallel to each of the retrieved bits a segmented search, each search indexed using an order number of the respective bit being checked, and correcting a bit whose search indicates an error.

16 Claims, 6 Drawing Sheets

(56) References Cited

OTHER PUBLICATIONS

"Embedded High-Speed BCH Decoder for New-Generation NOR Flash Memories" Xuegiang Wang, Dong Wu, Chaohong Hu, Liyang Pan, Runde Zhou Institute of Microelectronics, Tsinghua University; Tsinghua National Laboratory for Information Science and Technology, Beijing, 100084, China; Intel Technology Development (Shanghai) Co. Ltd, Shanghai, China; IEEE 2009 Custom Integrated Circuits Conference (CICC), pp. 195-198.

"An On-Chip High-Speed 4-bit BCH Decoder in MLC NOR Flash Memories" Xuegiang Wang, Dong Wu, Liyang Pan, Runde Zhou—Institute of Microelectronics Tsinghua University Beijing, China Chaohong Hu—Flash Product Group Intel Technology Development (Shanghai) Co., Ltd Shanghai, China; IEEE Asian Solid-State Circuits Conference Nov. 16-18, 2009 / Taipei, Taiwan, pp. 229-232.

\* cited by examiner

METHODS, CIRCUITS, SYSTEMS AND COMPUTER EXECUTABLE INSTRUCTION SETS FOR PROVIDING ERROR CORRECTION OF STORED DATA AND DATA STORAGE DEVICES UTILIZING SAME

FIELD OF THE INVENTION

The present invention relates generally to the field of data storage. More specifically, the present invention relates to methods, circuits, systems and computer executable instruction sets for providing error correction of stored data and data storage devices utilizing the same.

BACKGROUND

Different types of flash memories may include NAND and NOR arrays which generally differ in the architecture of the memory array. Two types of popular NOR arrays are Serial Peripheral Interface (SPI) and parallel NOR arrays. The former (SPI) is characterized by the data being outputted from the memory in small segments (typically 1, 2 4 and/or 8 bits) while the latter (parallel) is characterized by the data being output to a user in larger segments (typically 8 or 16 bits). A user may be any apparatus or circuit configured to access the memory array and/or receive data from the memory such a processor, a buffer, an output and more.

NAND technologies may utilize error correction code (ECC) blocks to reduce errors in the outputted data from the array. Error correction for both SPI and parallel NOR proves more difficult since the data is output very quickly which in many products does not leave enough time for the calculations required for the ECC block. In order to save time and/or meet specification timing requirements parallel calculations may be utilized but at a substantial area increase/penalty/cost.

Several technologies may be utilized to produce NVM arrays such as floating gate, MirrorBit, additional charge trapping technologies and more.

Figure 1:
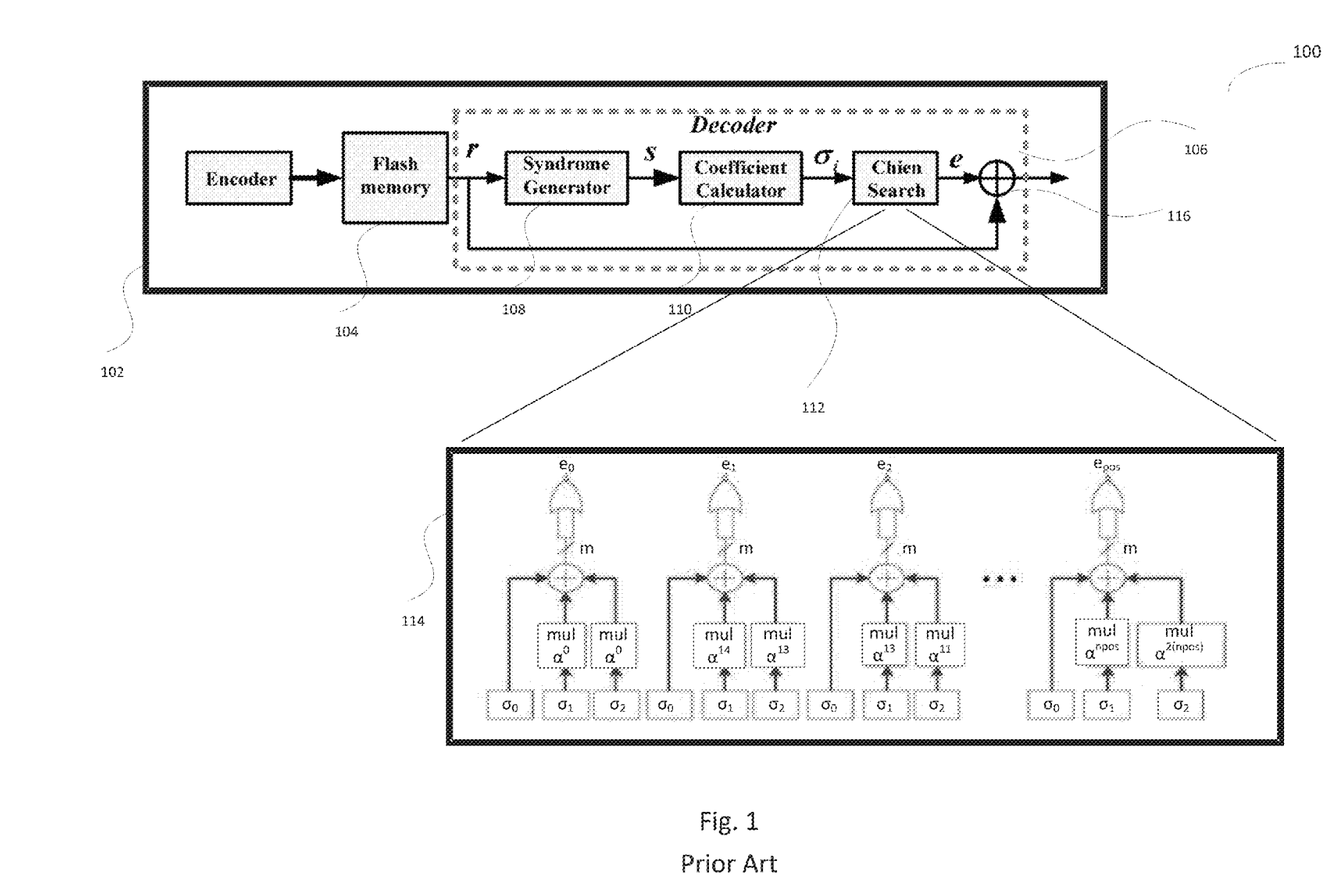
FIG. 1 depicts a prior art NVM memory circuit.

Turning now to prior art FIG. 1, depicted is an NVM memory circuit 100 which includes am encoder 102 configured to encode data to be stored in/on Flash memory 104. Flash memory 104 may be a Non-Volatile flash Memory (NVM). Flash memory 104 may be read and data (r) may be output to decoder 106 which may include an ECC block. Based on the data (r) a Syndrome Generator 108 may relay the generated Syndrome(s) S to a Coefficient Calculator 110 which may further relay the coefficient(s) σto a Chien Search block/module/circuit 112. As depicted in element 114 which is a gate level example implementation of Chien search block 112, all n bits of data r are output and utilized in parallel to calculate the appropriate Chien search block 112 result for each appropriate bit $e_i$. The resultant $e_i$ results are then transferred through a XOR gate 116 to inverse any incorrect bit and the resultant corrected data bits are output from the NVM memory circuit 100. The calculation of the Chien search block result $e_i$ is carried out substantially in parallel, the $e_i$ result for each data bit r is calculated in a dedicated circuit at substantially the same time, delays due to propagation and other electrical delays known in the art or otherwise may occur.

SUMMARY OF THE INVENTION

According to some embodiments, a method for reading a set of bits from an array may include: retrieving each of the set of bits from the array substantially in parallel, applying substantially in parallel to each of the retrieved bits a segmented search, each search indexed using an order number of the respective bit being checked, and correcting a bit whose search indicates an error, the array may be an SPI NVM array or a Parallel NOR NVM array, a DRAM and more.

According to some embodiments, the method of reading a set of bits may further include outputting a corrected set of bits. The segmented search may be a segmented Chien search and may include a bit error correction BCH Chien code and/or a multiple bit BCH Chien search code including 2 or more bits error correction or a different algorithm other than BCH may be utilized. The NVM array may be a Mirrorbit NVM array, a charge trapping NVM array and/or a floating gate NVM array and more. The set of bits may include a predetermined number of bits between 4 and 32.

According to some embodiments, an apparatus may include an NVM array (SPI NVM array and/or Parallel NOR NVM array or otherwise), logic circuitry including error correction circuitry to apply substantially in parallel a Chien search on each of a set of bits from a segment of the NVM array and correct a bit whose Chien search indicates an error.

According to some embodiments, the Chien search may be a 2 bit error correction BCH code. The set of bits may include 2 bits, 4 bits, 8 bits and/or 16 bits or otherwise and the apparatus may further include a processor to access the NVM array and read data stored in the NVM array.

According to some embodiments, a method of operating a system may include accessing an NVM array to obtain data stored in/on the NVM array, retrieving a chunk of the data including a set of bits from the SPI NVM array substantially in parallel, applying substantially in parallel to each of the set of bits a multiple bit error correction (For example, 3 or more bit error correction) segmented Chien search, each Chien search indexed using an order number of the respective bit being checked, correcting a bit whose Chien search indicates an error, and relaying the set of bits of stored data.

According to some embodiments, the method of operating a system may also be characterized in that the NVM array is selected from the group consisting of: SPI NVM array and/or Parallel NOR NVM array. The array may be a Mirrorbit NVM array, a charge trapping NVM array and/or a floating gate NVM array or otherwise. The set of bits may include a predetermined number of bits between 4 and 32 and the set of bits may be a segment of bits.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention includes methods, circuits, systems and computer executable instruction sets for providing error correction of stored data. According to embodiments, there may be provided a data reading circuit for reading stored data from a data storage medium (e.g. Disk, NVM, etc.), wherein reading may include retrieving each of a set of bits from the data storage medium (for example a NOR array) either substantially in parallel or otherwise together as a batch. The reading circuit may include or be otherwise functionally associated with an error correction code (ECC) circuit adapted to apply substantially in parallel to each of a segment of the retrieved bits a search such as a Chien search. The search is applied/carried out so that errors in the data/bits are found per bit i.e. the data is "searched" reviewed on a bit level for mistakes. A popular search is a Chien search however additional/supplementary searches may be applied.

According to some embodiments, a Chien search may be indexed, each of the Chien searches may use an order number corresponding to the respective bit being checked. According to further embodiments, the ECC may be adapted to correct, by inverting, retrieved bits whose Chien search (formula) indicates an error. Optionally, the Chien search may include/be implemented in part using a Bose-Chaudhuri-Hocquenqhem (BCH) algorithm and accordingly, may be a BCH Segmented Chien search.

According to some embodiments, utilization of the SPI and parallel NOR trait/characterization/standard that only a segment of the chunk is output at a time, enables utilizing this inherent slow latency to substantially save area on the memory die, based on the advancement of applying the Chien search to only a group of bits out of the chunk at a time. This may further enable selecting a higher number of corrections to be corrected by the function. These traits, results and technological advancements will be further discussed and/or demonstrated below.

Figure 2:
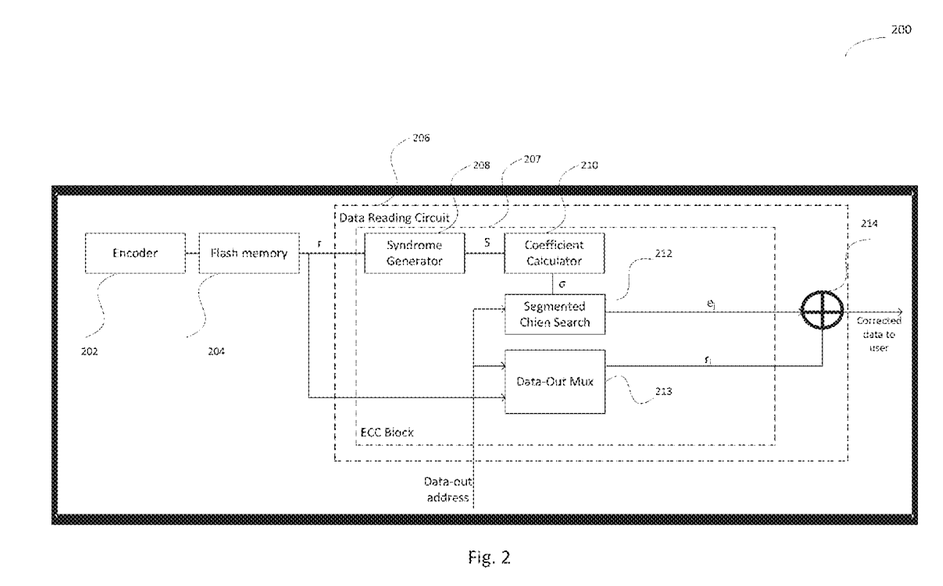
FIG. 2 depicts a block level NVM memory circuit including error correction circuitry in accordance with some embodiments of the present invention.

Turning to FIG. 2, depicted is a block level NVM memory circuit 200 in accordance with some embodiments which includes an encoder 202 configured to encode data to be stored in/on Flash memory 204. Flash memory 204 may be a Non-Volatile flash Memory (NVM) and/or a disk or otherwise. Flash memory 204 may be read and data (r) (optionally, the data (r) is the size of a chunk) may be output to data reading circuit 206 which may include an ECC block 207. Data r may include stored data and redundancy bits. Syndrome Generator 208 may receive the data (r) and calculate/produce one or more syndrome(s) (S) The number of syndromes produced may be dependent on or equal to the number of error bits to be corrected and more. Syndrome Generator 208 may relay the generated Syndrome(s) S to a Coefficient Calculator 210. Coefficient Calculate 210 may produce coefficient(s) σ to a segmented Chien Search block 212. Furthermore, Segmented Chien Search block 212 may retrieve/read/obtain a data-out address/index indicating the location/address/placement of a set of bits within data (r). Segmented Chien Search Block 212 may apply substantially in parallel to each of the received data-out address bits a segmented Chien search. The group of bits associated with the data out address/indexes being processed may be retrieved from a buffer, temporary storage, maintained on bit lines, retrieved via a mux or other circuitry, for example: selected via Data-out-Mux 213. The group of bits may be relayed to XOR 214. Accordingly, a bit whose Chien search indicates an error may be corrected, for example by inverting the value of the bit, The order number may be calculated locally in the circuit based on a received location and the length of the group of bits and/or by utilizing a counter or other circuitry.

According to some embodiments, flash memory 204 may be a SPI NVM array or a parallel NOR NVM array. Data retrieved from the array (r) may be n bits long (for example, any value within the range of 32-1024 of data and optionally additional redundancy bits) . . . . With regard to redundancy bits, it is understood that the number of minimal redundancy bits may be determined/calculated based on the number of correction bits (how many corrections the system designer designates as needing to be fixed) and/or the number of data bits (from which the errors are found and which may be corrected). Note that the number of error bits to be corrected may be termed 'n bits error correction', where n may be any positive integer. The number of error bits to be corrected is a predetermined parameter, the higher the value the more accurate the output data may be/there may be less mistakes output. The number of coefficients calculated by Coefficient Calculator 210 may be dependent on the number of error bits to be corrected. As discussed above, some of the steps are carried out in substantially in parallel; however, delays due to propagation and other electrical delays/mismatches known in the art or otherwise may occur. Furthermore a few joint or overlapping gates/circuit elements may be used. Optionally, the size of the group of bit may be equal to the size of a segment (which is the number of bits output in parallel from the NVM memory circuit 200 to a user at once or the number of data output pins of the NVM memory circuit 200.

Following is an example discussion of specific algorithms; operators and functions which may be used to carry out ECC block 207. While specific matrixes, data length and number of bits to be corrected are set for the example it is understood that there are many more applicable combination of matrixes, data lengths and number of error bits to be selected and that the invention is not limited to the specific example discussed below.

According to some embodiments, Syndrome Generator 208 may produce/calculate one or more Syndrome(s). As discussed above, the number of Syndrome(s) to be calculated may be dependent on the number of error bits to be corrected. For example, for a 2 error bits to be corrected 2 Syndromes may need to be calculated. In one example, the r vector which may include 274 bits of data (which may include 256 bits of real data and 18 bits of redundancy) may be multiplied by a Galois Field GF ($2^9$) matrix.

$$r[2:274] \times \begin{bmatrix} 1 & 1 \\ \alpha & \alpha^3 \\ ... & ... \\ \alpha^{273} & \alpha^{308} \end{bmatrix}$$
$$\phantom{r[2:274] \times}\ \ S1\quad S3$$

It is understood that different GF matrixes are applicable. Some of the considerations for selecting a specific GF matrix (and/or the generator associated with polynomial which represents a specific GF matrix) may include: gate count and speed of the calculation. The size of the GF matrix may be selected also based on the length of the chunk to be read from the memory array. For example, $2^9$=512 which means that a chunk of up to 512 bits may be processed utilizing this GF matrix. So a chunk with a size of 274 bits (which is less than 512 bits) may be processed. If a chunk size including 512b of data+30b of redundancy is to be read, then a larger GF matrix is needed and a $2^{10}$ matrix may be utilized. It is understood that in this example, the number of redundancy bits is dependent also on the number of error bits to correct. Accordingly, the number of error bits may affect the size and selection of the GF matrix.

For example each element of the matrix may be 9 bits wide, accordingly S1 and S3 may also be 9 bits wide. This calculation may be implemented in circuitry, using a XOR between the appropriate bits of raw data for each of the 9 bits thus producing S1 and S3.

According to some embodiments, Coefficient Calculator 210 may be configured to calculate/find/produce coefficient(s) of a predefined equation. The order of the equation may be dependent on the number of error bit to be corrected. For example, a 2 error bit equation may be:

$$\sigma_0 + \sigma_1 * x + \sigma_2 * x^2 = 0$$

According to the theory:

$$\sigma_0 = S1^3 + S3$$

$$\sigma_1 = S1^2$$

$$\sigma_2 = S1$$

Implementing calculation of $S1^3$ and $S1^2$ may be carried out by ROM code configured to store the values (look-up table) or by a dedicated hardware translation code circuitry. with regard to SPI and Parallel NOR the latter may be preferable, as the former may be too slow depending on access time to the ROM and time allotted to output the data stored in the flash memory.

In another example, a 3 error bit equation may be:

$$\sigma_0 + \sigma_1 * x + \sigma_2 * x^2 + \alpha \sigma_3 * x^3 = 0$$

According to the theory, for example:

$$\sigma_0 = S1^3 + S3$$

$$\sigma_1 = S1S3 + S1^4$$

$$\sigma_2 = S1^2 S3 + S5$$

$$\sigma_3 = (S1^3 + S3)^2 + S1^3 S3 + S1 S5$$

Implementing calculation of S1S3, for example, may require a dedicated/specific GF multiplier to be designed in hardware/circuitry.

According to some embodiments, when a binary BCH code is used, $$S1^2 = S2$$

Accordingly, the value can be calculated directly from the GF ($2^9$) matrix similar to S1 and S3 discussed above.

Segmented Chien search 212 may receive the coefficients from Coefficient Calculator 210. The segmented Chien search may be configured to find the roots of the equations that may correlate to the location of the errors. For example the roots of the following equation:

$$\sigma_0 + \sigma_1 * x + \sigma_2 * x^2 = 0$$

In some embodiments, for example, if the Flash memory is a SPI Flash or has traits/characteristics similar to an SPI Flash, the segmented Chien search may utilize SPI spec, wherein a segment out of a chunk of data bits are output at a time (For example: 2, 4, 8 or 16 bits out of 256 or 512 bits per chunk or otherwise). Accordingly, not all of the bits of the chunk need to be corrected, but rather, per cycle/per NVM read access it is enough to carry out the Chien Search on a segment of the chunk or on a group of bits out of the chunk.

According to some embodiments, an applicable method for carrying out the Chien search may be placing the index/location of a bit within the chunk X to see if the equation above is elapsed. For example, the result of the equation may be tested to see if the equation (with placement of the coefficients and the index/location X) actually equals Zero, indicating an error, or equals One, indicating that the bit is correct) In this approach, GF ($2^9$) multiplier module may be used/utilized for example, a GF multiplier module may be executed with a dedicated hardware circuit based on AND and XOR gates or otherwise.

According to some embodiments, what is required may be 16 multiplier for $\sigma_1 \ast x$ and 16 multipliers for $\sigma_2 \ast x^2$ Once we have the result we may check 16 options of the equation above and pass/relay the results through the XOR. In one example, if the result is not elapsed, this may mean that the respective bit (which is coming out in the respective location of the elapsed result) is calculated as correct. In a 16 bit segment example—32 real GF multipliers may be required. Furthermore, the relevant coefficients may be temporarily stored so that they can be used/applied for the different indexes of location within a chunk (X).

Figure 3:
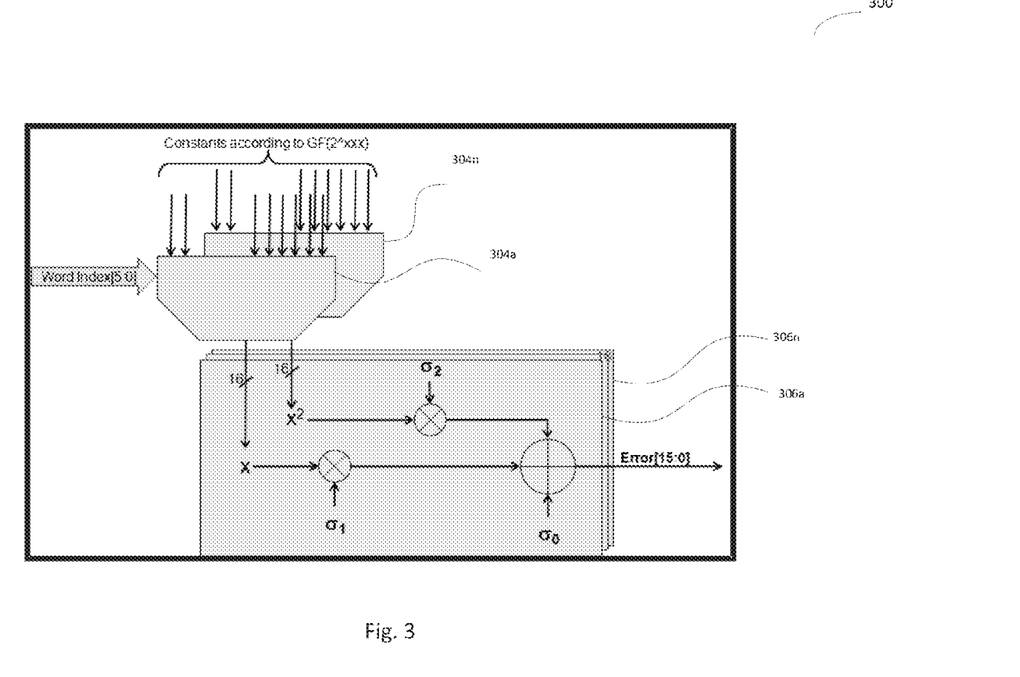
FIG. 3 depicts an example block level implementation of an example Segmented Chien Search in accordance with some embodiments of the present invention.

Turning now to FIG. 3, an example block level implementation of an example segmented Chien search 300 is shown. Additional implementations may vary based on selected implementation, chunk size, segment size, number of error bits to be corrected, selected matrixes and more. In this example, a 16 bit set of bits is shown but as discussed in this application other sizes of a set of bits may be applicable. Segmented Chien search 300 may receive a word index to mark which segment out of the chunk is currently being processed and/or which segment is to be output to a user. In this example, the input includes 6 bits, however, the number of bits received may vary and is dependent on the number of bits/length of the chunk and the number of bits in a segment and/or the number of bits to be processed in parallel. The constants calculated from the coefficient calculator may also be input/received (input marker 304a-304n). In this example, a Galois Function is shown but additional functions/algorithms, matrixes may be applicable. Iterative function block 306a-306n may carry out/calculate/find the result for the relevant selected function (in the example the function $\sigma_0 + \sigma_1 \ast x + \sigma_2 \ast x^2 = 0$ is selected). X, which is the index/location of the bit within the chunk is inserted/placed in the function and the output ERROR [15:0] may indicate the location within the chunk of the bits that need to be corrected (for example, inverted). Note that several parameters of the figure, for example, the number of input marker blocks 304a-304n, the number of iterative function blocks 306a-306n, the length of ERROR [15:0] and more are dependent on the segment length (in this example: 16) and/or the number of bits to be processed at a time in parallel (which may be equal or different than the segment size) and may be modified accordingly.

It is understood that attempting to implement this solution in a non-segmented manner (for example see Prior Art FIG. 1) would not be desirable, the area cost and/or time consumption of carrying out the parallel calculation for a whole chunk at a time may be considered too great in terms of area. According to some embodiments, for the segmented Chien search the iterative function block may be implemented generically and the indexes inputted and the result calculated per read cycle so adding an additional branch for an additional error bit correction would only add a branch per segment or per group of bits. Furthermore, implementation of the segmented Chien search 300 is substantially similar regardless of the scaling of chunk size. In summary, the segmented Chien search block may be considered both applicable for different chunk sizes as it is dependent on the number-of bits/segment size and not chunk size and may also be considered scalable to different number of error bits as the cost/penalty for adding additional branches per bit is applicable since the Chien search is carried out only on a group of bits at a time.

Figure 4:
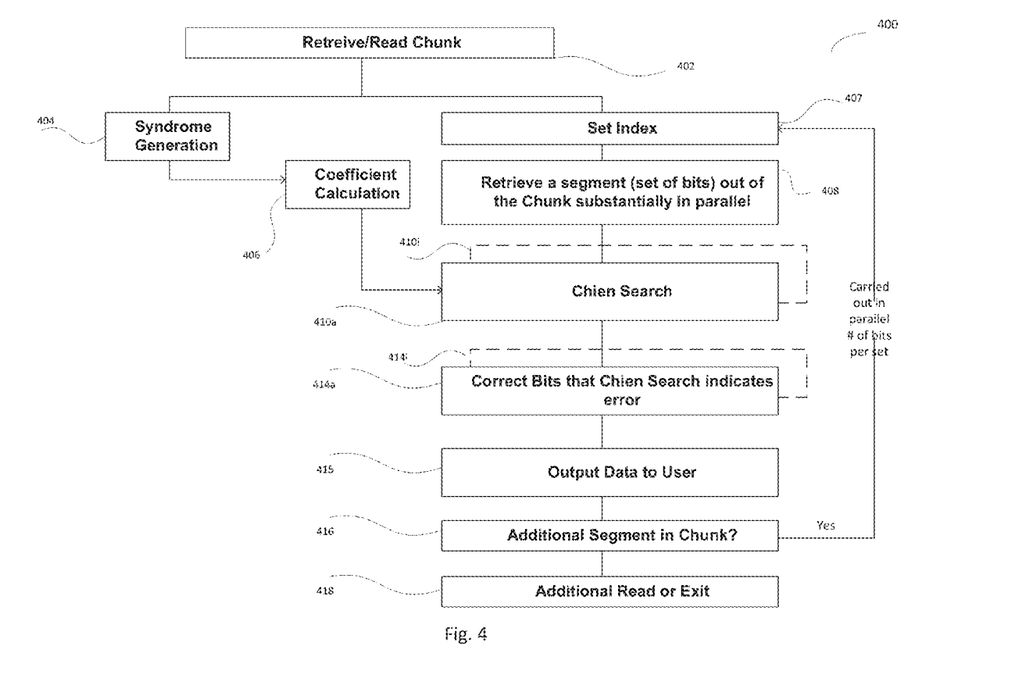
FIG. 4 is a flow chart of an example method for providing error correction of stored data in accordance with some embodiments.

Turning to FIG. 4, depicted is flow chart 400 for an example method for providing error correction of stored data in accordance with some embodiments. Generally, the example method 400 may be carried out asynchronously, synchronously, a combination of the two or otherwise. Initially, a read chunk (including data bits and/or redundancy bits) may be retrieved from an associated memory (step 402). Based on the read bits one or more Syndrome(s) may be generated (step 404). The Syndrome(s) may then be relayed and subsequently a set of coefficients may be calculated (step 406). An index is set (step 407), the index may correlate to a location/address of a set of bits within the read chunk. Based on the index a correlating/appropriate set of bits is retrieved from the chunk (step 408). Optionally, the size/length/amount of the set of bits is equal to a segment of the chunk. A segmented Chien search is carried out based on the set index and the received coefficient(s) (step 410a-410i), Any bits indicated to have an error are then corrected (step 414a-414i) and the data is output to a user (step 415), The number of blocks included in each of the groups 410a-410i and 414a-414i may depend on the size/length of the set of bits (the number of bits in the set of bits) so that for each step (410 and 414) there is a block carried out substantially in parallel for each bit. The same steps (407-414) may then be carried out on a next set of bits (return to step 407). When the whole chunk has been processed (step 418) either an additional read may be carried out (return to step 402) or the process/method/algorithm may be exited. Note that, optionally, while steps 407-416 are carried out on a set of bits/group of addresses associated with a set of bits recursively until the entire chunk has been processed the steps 404 and 406 are carried out once per chunk. Optionally, if the number of bits per set is not equal to the segment size, then an additional step may be required, for example temporary storing of the corrected data for outputting and/or buffering of the corrected data or otherwise.

Figure 5:
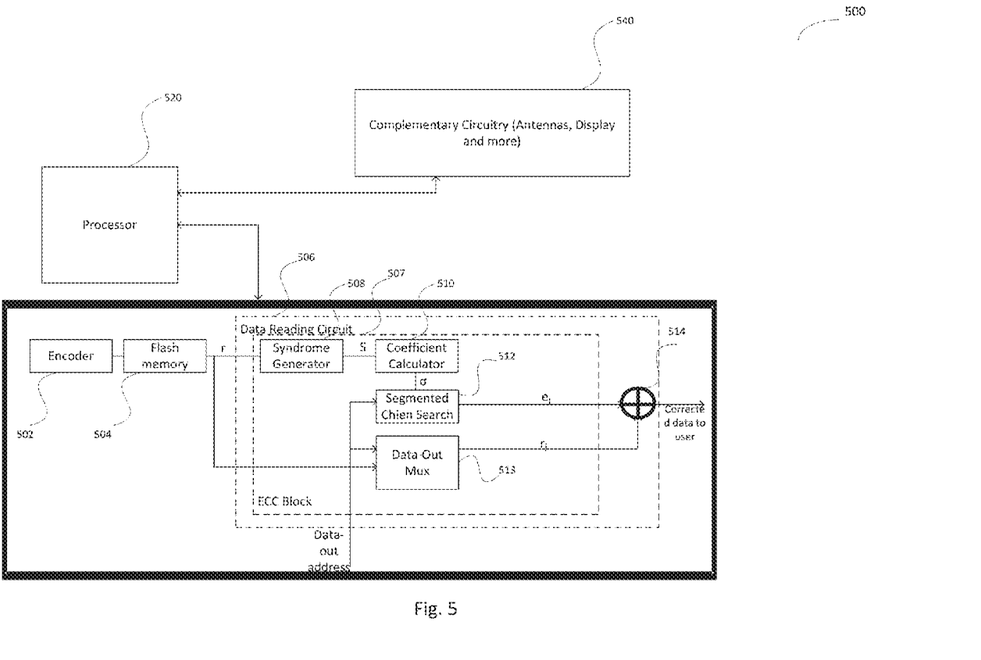
FIG. 5 depicts a block level depiction of a system including error correction circuitry in accordance with some embodiments.

Turning to FIG. 5, depicted is a block level depiction of a system 500 in accordance with some embodiments, including an NVM memory circuit 501 which is substantially similar to NVM memory circuit 200 of Fig. NVM memory circuit 501 further includes elements 502-514 which may be substantially similar to elements 202-214 also of FIG. 2. System 500 further includes a processor 520 configured to access NVM memory circuit 501 to obtain data stored thereon. The data stored in/on NVM memory circuit 501 may include data, code, encrypted data and more. Processor 520 may be further configured to receive/and or relay information and or instructions from complementary circuitry 540. Complementary circuitry 540 may include some or all of the following elements and more: screens, keyboards, touchscreens, medical instruments circuitry and mechanics, robotic circuitry and devices, antennas, GPS, WIFI circuitry, accelerometer, video game processing circuitry, Bluetooth etc. Some examples of products and or applications that may include system 500 are personal computers, PDAs, digital audio players, digital cameras, mobile phones, synthesizers, video games, scientific instrumentation, industrial robotics, medical electronics, and more.

Figure 6:
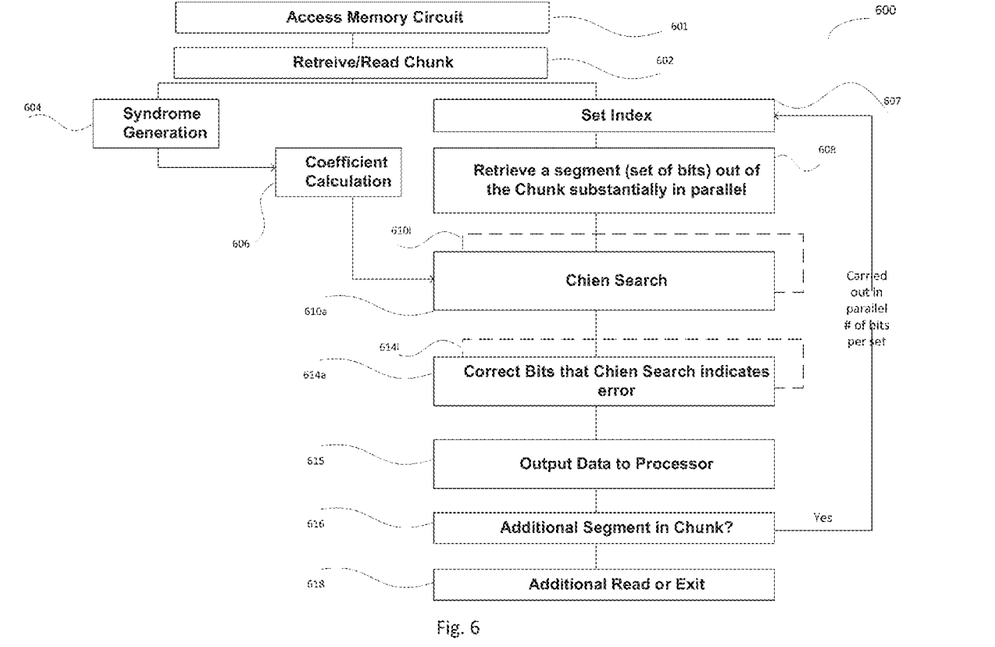
FIG. 6 is a flow chart of an example method for accessing a NVM memory circuit with error correction for the stored data in accordance with some embodiments.

Turning to FIG. 6, depicted is flow chart 600 for an example method for accessing a NVM memory circuit with error correction for the stored data in accordance with some embodiments. Steps 602-616 are substantially similar to steps 402-416 of FIG. 4. Note that step 615 is similar to step 415, where the user of FIG. 4 is a processor. Flow chart 600 further includes accessing an NVM memory circuit (step 601) and outputting/relaying the (corrected) data to a processor (step 615). Additional steps not depicted may include using the relayed data for additional operation of the system (operating peripheral circuitry, displaying the data and more and/or relaying data from peripheral circuitry to the NVM circuitry for storage.

Furthermore, according to some embodiments, outputting of the data (step 615) may be carried out substantially directly after/following the Chien search analysis (step 614*a*) so that no additional processing/analyzing of the data is necessary between correction and outputting of the information/data. Note that carrying out the search (step 614*a*) on the data as it is about to be output (step 615) may utilize the inherent slow latency of the output of data to save area of the ECC block or read flow latency (time).

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method for reading a set of bits from an array, said method comprising:
   triggering retrieval of a read chunk from the array;
   retrieving the set of bits from the array wherein the set of bits is a segment of bits from the read chunk;
   generating one or more syndromes for the read chunk;
   calculating one or more coefficients for the read chunk based on the one or more syndromes for the read chunk;
   applying to the retrieved bits an indexed segmented bit level error correction code based search on the set of bits; wherein said search is indexed using an order number correlated to a location of the set of bits within the read chunk and utilizing the one or more coefficients for the read chunk in the error correction code based search on the set of bits; and
   correcting a bit whose search indicates an error.

2. The method according to claim 1, further comprising outputting a corrected set of bits.

3. The method according to claim 1, wherein the indexed segmented bit level error correction code based search can correct at least two error bits.

4. The method according to claim 1, wherein said array is selected to be one of the group consisting of: a Mirrorbit NVM array, a charge trapping NVM array, a floating gate NVM array and a DRAM.

5. The method according to claim 1, wherein the set of bits includes a predetermined number of bits between 4 and 32.

6. The method according to claim 1, wherein said array is an NVM array selected to be one of the group consisting of: SPI NVM array and Parallel NOR NVM array.

7. An apparatus comprising:
   logic circuitry including error correction circuitry configured to retrieve a read chunk from a non-volatile memory (NVM) array, generate one or more syndromes for the read chunk, calculate one or more coefficients for the read chunk based on the one or more syndromes and apply substantially in parallel a search on each of a set of bits from a segment of the read chunk and correct a bit whose search indicates an error utilizing the one or more coefficients for the read chunk wherein said search is indexed using an order number correlated to a location of the set of bits within the read chunk.

8. The apparatus according to claim 7, wherein the error correction circuitry includes at least two bit error correction code.

9. The apparatus according to claim 7, wherein said array is selected to be one of the group consisting of: a Mirrorbit NVM array, a charge trapping NVM array, a floating gate NVM array and a DRAM.

10. The apparatus according to claim 7, wherein the set of bits includes 8 bits.

11. The apparatus according to claim 7, wherein the set of bits includes 16 bits.

12. The apparatus according to claim 7, further comprising a processor configured to access the NVM array and read data stored in the NVM array.

13. The apparatus according to claim 7, wherein said array is selected to be one of the group consisting of: SPI NVM array and Parallel NOR NVM array.

14. A method of operating a system comprising:
   accessing an SPI NVM array to obtain data stored therein;
   retrieving a chunk of the data including a set of bits from the SPI NVM array substantially in parallel;
   generating one or more syndromes for the read chunk;
   calculating one or more coefficients for the read chunk based on the one or more syndromes;
   applying substantially in parallel to each of the set of bits a multiple bit error correction code including a segmented Chien search utilizing the one or more coefficients for the read chunk, each Chien search indexed using an order number correlated to a location of the set of bits being checked within the chunk;
   correcting a bit whose Chien search indicates an error so that a corrected set of bits is produced; and
   outputting the corrected set of bits to a user;
   wherein said multiple bit error correction code is a 3 or more bit error correction code.

15. The method according to claim 14, wherein said NVM array is selected to be one of the group consisting of: SPI NVM array and Parallel NOR NVM array.

16. The method according to claim 14, wherein said array is selected to be one of the group consisting of: a Mirrorbit NVM array, a charge trapping NVM array, a floating gate NVM array and a DRAM.

* * * * *